(12) United States Patent
Ishihara et al.

(10) Patent No.: US 8,277,563 B2
(45) Date of Patent: Oct. 2, 2012

(54) PLASMA PROCESSING METHOD

(75) Inventors: Masunori Ishihara, Kudamatsu (JP);
Masamichi Sakaguchi, Kudamatsu (JP);
Yasuhiro Nishimori, Hikari (JP);
Yutaka Kudou, Kudamatsu (JP);
Satoshi Une, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/019,131

(22) Filed: Feb. 1, 2011

(65) Prior Publication Data

US 2011/0120495 A1    May 26, 2011

Related U.S. Application Data

(63) Continuation of application No. 12/437,941, filed on May 8, 2009, now Pat. No. 7,909,933, which is a continuation of application No. 11/834,046, filed on Aug. 6, 2007, now abandoned.

(30) Foreign Application Priority Data

Mar. 8, 2007 (JP) ................................. 2007-058664

(51) Int. Cl.
*B08B 7/00* (2006.01)

(52) U.S. Cl. .................. 134/1.1; 134/1; 134/26

(58) Field of Classification Search ............ 156/345.31, 156/345.32; 118/718, 719; 204/298.23–298.29, 204/298.35; 414/217–221, 805, 935–941
See application file for complete search history.

(56) References Cited

U.S. PATENT DOCUMENTS

| | | | |
|---|---|---|---|
| 4,115,184 A | | 9/1978 | Poulsen |
| 5,968,279 A | * | 10/1999 | MacLeish et al. ............ 134/1.2 |
| 6,136,211 A | * | 10/2000 | Qian et al. .................. 216/37 |
| 6,814,087 B2 | * | 11/2004 | Chandran et al. ............ 134/1.1 |
| 2006/0273072 A1 | * | 12/2006 | Tan et al. .................. 216/67 |
| 2007/0042132 A1 | * | 2/2007 | Seo et al. .................. 427/569 |

FOREIGN PATENT DOCUMENTS

| | | |
|---|---|---|
| JP | 08-115901 | 5/1996 |
| JP | 2001-207265 | 7/2001 |
| JP | 2001-335938 | 12/2001 |
| JP | 2004-281832 | 10/2004 |
| JP | 2004281832 A * | 10/2004 |
| JP | 2006-162612 | 6/2006 |

OTHER PUBLICATIONS

Machine English Translation of JP 2004-281832A.*
English translation of JP 2004-281832.

* cited by examiner

*Primary Examiner* — Michael Kornakov
*Assistant Examiner* — Nicole Blan
(74) *Attorney, Agent, or Firm* — Antonelli, Terry, Stout & Kraus, LLP.

(57) ABSTRACT

The invention provides a plasma processing method which includes (i) feeding a transferring gas which decreases a pressure difference between a processing chamber and a transfer chamber in order to prevent particles from adhering a processing sample, to be processed, passed to the processing chamber, before transferring the sample into the processing chamber; (ii) transferring the sample into the processing chamber while continuing to feed the transferring gas to the processing chamber; (iii) generating a plasma from the transferring gas in the processing chamber while continuing to feed the transferring gas to the processing chamber after the step of transferring the sample; and (iv) changing a gas supplied to the processing chamber from the transferring gas used in the step of generating the plasma to a processing gas for subjecting the processing sample, different from a cleaning sample, to plasma processing.

8 Claims, 4 Drawing Sheets

PLASMA PROCESSING METHOD

The present application is based on and claims priority of Japanese patent application No. 2007-58664 filed on Mar. 8, 2007, the entire contents of which are hereby incorporated by reference. This application is a Continuation application of application Ser. No. 12/437,941, filed May 8, 2009 now U.S. Pat. No. 7,909,933, which is a Continuation application of application Ser. No. 11/834,046, filed Aug. 6, 2007 now abandoned, the contents of which are incorporated herein by reference in their entirety.

BACKGROUND OF THE INVENTION

1. Field of the Invention

The present invention relates to a plasma processing method using a plasma processing apparatus comprising a plurality of plasma processing chambers for processing samples such as semiconductor wafers, a transfer chamber connected to the processing chambers for transferring samples and a supply system for supplying gas which is the same gas as the transferring gas supplied to the transfer chamber to both the transfer chamber and processing chambers or only to the processing chambers when transferring samples from the transfer chamber to the processing chambers, and specifically, relates to a method for reducing particles attached to the samples during the transferring of semiconductor wafers and other samples into the processing chamber, plasma processing of samples in the processing chambers and transferring of samples out of the processing chambers.

2. Description of the Related Art

In a conventional plasma processing apparatus that utilizes chemical reaction between processing gases and samples such as semiconductor wafers to process the samples, there are drawbacks in that reaction products, which are deposited on inner side walls of the processing chambers when processes generating reaction products are performed continuously, are detached from the walls and are attached to the samples, and in that the atmosphere containing residual components residing in the processing chamber affects the surface of the samples, causing defects such as short circuit of the semiconductor wiring and abnormal process dimension. A plasma processing apparatus further comprises a load lock chamber for transferring samples stored in cassettes to the interior of the apparatus, and generally comprises a transfer chamber adjacent to the load lock chamber for transferring the samples sent into the apparatus to multiple processing chambers disposed adjacent thereto.

However, there has not been any consideration on the flinging up of particles caused by pressure fluctuation within the processing chamber during the continuous processing from when the sample is carried into the processing chamber to when the sample having been subjected to plasma processing is carried out of the processing chamber. In general, gas supplied to the processing chamber as transferring gas when the sample is carried into the processing chamber is stopped when the sample is subjected to plasma processing, high-vacuum evacuation process is performed, and thereafter, processing gas is introduced to the processing chamber to generate plasma to perform plasma processing. Therefore, after stopping the supply of transferring gas before introducing processing gas, the pressure within the processing chamber is reduced from the pressure of the transferring gas supplied to the processing chamber to high-vacuum evacuation pressure, and then fluctuated to the pressure of plasma generation atmosphere of the processing gas, and along with this pressure fluctuation in the processing chamber, the particles deposited on the inner side walls of the processing chamber are flung up. After terminating plasma, the supply of plasma processing gas is stopped and high-vacuum evacuation is performed before supplying transferring gas, so that a similar pressure fluctuation occurs in the processing chamber, causing particles deposited on the inner side walls of the processing chamber to be flung up by pressure fluctuation in the processing chamber similar to when the plasma processing is started.

The art of reducing particles in a plasma processing apparatus is disclosed, for example in Japanese Patent Application Laid-Open Publication No. 2004-281832 (patent document 1), in which gas is supplied from a gas supply unit to either the processing chambers or the transfer chamber or to both the processing chambers and transfer chamber when carrying the samples into and out of the processing chambers, so as to minimize the pressure difference between the chambers and to prevent generation of particles caused by flinging up of particles by turbulent airflow.

The present applicant has proposed, for example in Japanese Patent Application No. 2006-162612 (patent document 2), to switch the scavenging gas supplied to the processing chamber to processing gas, perform plasma processing by generating plasma from processing gas, and after terminating the plasma processing, maintaining plasma while switching from processing gas to scavenging gas. However, the above document does not disclose how a sample is carried into the processing chamber from the transfer chamber while supplying transferring gas into the processing chamber, how plasma is generated from transferring gas, how transferring gas is switched to processing gas while maintaining plasma to perform plasma processing, how processing gas is switched to transferring gas while maintaining plasma by processing gas, and how plasma is terminated and then the sample is carried out of the processing chamber to the transfer chamber.

SUMMARY OF THE INVENTION

The object of the present invention is to provide a plasma processing apparatus and a plasma processing method capable of minimizing pressure fluctuation in the processing chamber during a series of processes from the carrying in of the sample to the processing chamber, plasma processing of the sample and carrying out of the sample, and thereby reducing the attaching of particles to the sample.

In order to achieve the above object, the present invention supplies transferring gas to the processing chamber when transferring a sample from the transfer chamber to the processing chamber and maintains the supply of transferring gas to the processing chamber even after transferring the sample. During plasma processing, plasma is generated from the transferring gas supplied into the processing chamber, and then the transferring gas is switched to processing gas while maintaining plasma to start plasma processing. Thereafter, at the end of the plasma processing, the supplied gas is continuously switched from processing gas to transferring gas while maintaining plasma, then the plasma is terminated, and the supply of transferring gas is maintained after terminating plasma to carry the sample out of the processing chamber.

According to the above-described method, plasma is generated from transferring gas, and the plasma is maintained while continuously switching supplied gas from transferring gas to processing gas, and after the plasma processing is terminated, the plasma is maintained while continuously switching supplied gas from processing gas to transferring gas, so that the sample is carried out while the supply of transferring gas is continued, and the pressure fluctuation within the processing chamber is minimized, according to which the attaching of particles to the sample due to flinging up of particles by airflow is reduced, and the attaching of particles is further reduced by evacuating the particles existing in the plasma at the time the plasma processing is terminated by the airflow of transferring gas.

DETAILED DESCRIPTION OF THE PREFERRED EMBODIMENTS

Figure 1A:
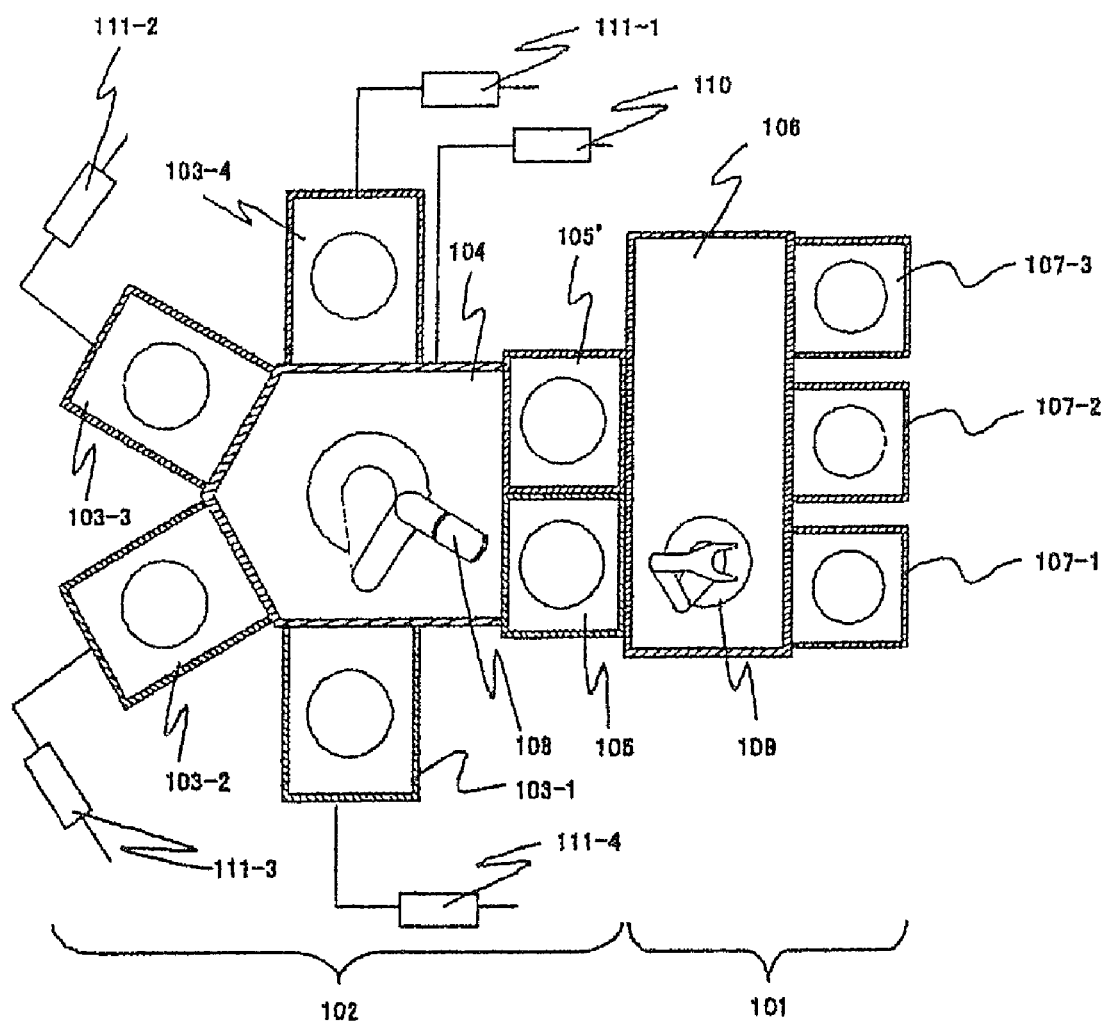
FIG. 1A is a cross-sectional plan view showing the structure of the plasma processing apparatus for carrying out the present invention.
Figure 1B:
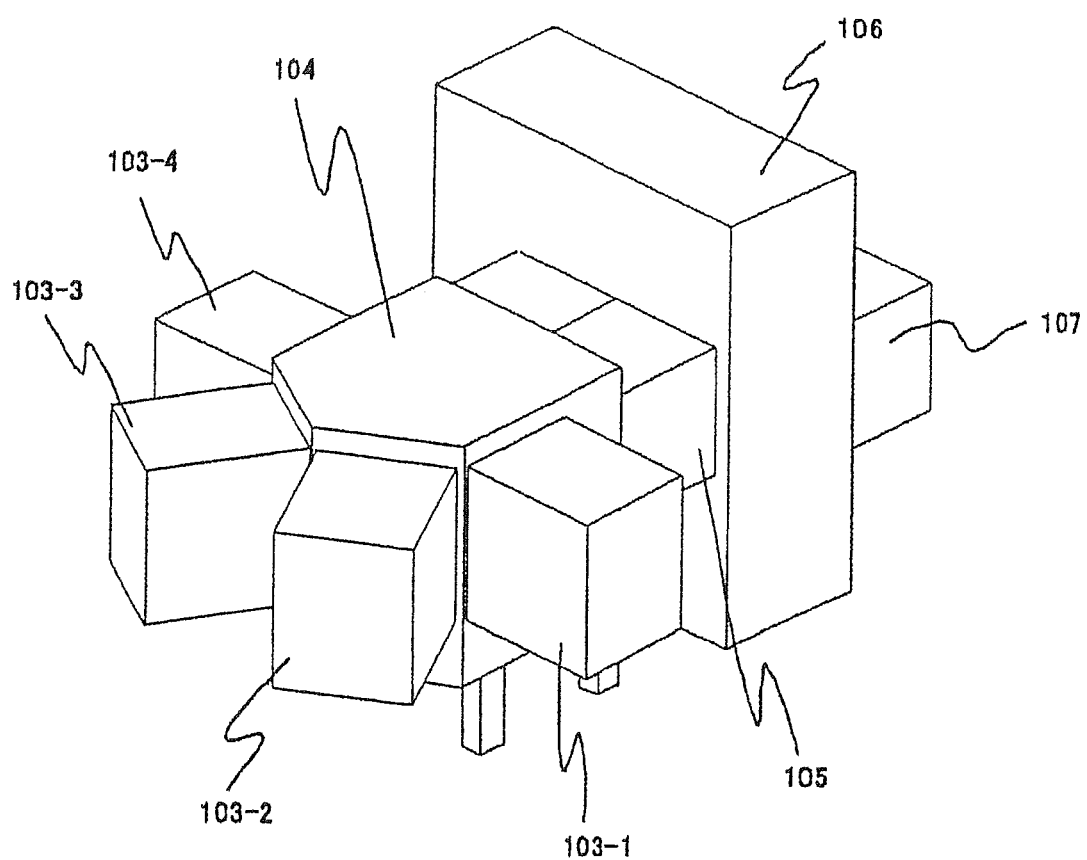
FIG. 1B is an upper perspective view showing the structure of the plasma processing apparatus for carrying out the present invention.

With reference to FIG. 1, the overall structure of a plasma processing apparatus for carrying out the present invention will be described. FIG. 1A is an upper cross-sectional view of the plasma processing apparatus, and FIG. 1B is a perspective side view thereof. The plasma processing apparatus is largely divided into an atmospheric block 101 and a processing block 102. The atmospheric block 101 is the portion in which wafers are transferred in atmospheric pressure to be stored or positioned, and the processing block 102 is the portion in which wafers are transferred under pressure depressurized from atmospheric pressure for processing, and the pressure thereof is varied while the wafer is placed therein.

The atmospheric block 101 has a housing 106 with a transfer robot 109 disposed therein, and includes cassettes 107-1 through 107-3 attached to the housing having processing samples or cleaning samples stored therein.

The processing block 102 has processing chambers 103-1, 103-2 and 103-3 being depressurized for processing samples, a transfer chamber 104 for transferring samples into the processing chambers, and lock chambers 105 and 105' connecting the transfer chamber 104 and the atmospheric block 101. The processing block 102 is a unit capable of being depressurized and maintained at a high vacuum pressure. The processing block 102 also comprises a transfer chamber gas supply system 110 and processing chamber gas supply systems 111-1, 111-2, 111-3 and 111-4. The transfer chamber gas supply system 110 and the processing chamber gas supply systems 111-1 through 111-4 constitute a system for supplying inert gas via a mass flow controller when carrying samples in and out of the transfer chamber 104 and processing chambers 103-1 through 103-4, so that the pressure difference between the chambers is minimized to prevent particles from being flung up and to prevent causes of particles such as the reaction product atmosphere from flowing into the transfer chamber 104 from the processing chamber 103 via airflow.

Figure 2:
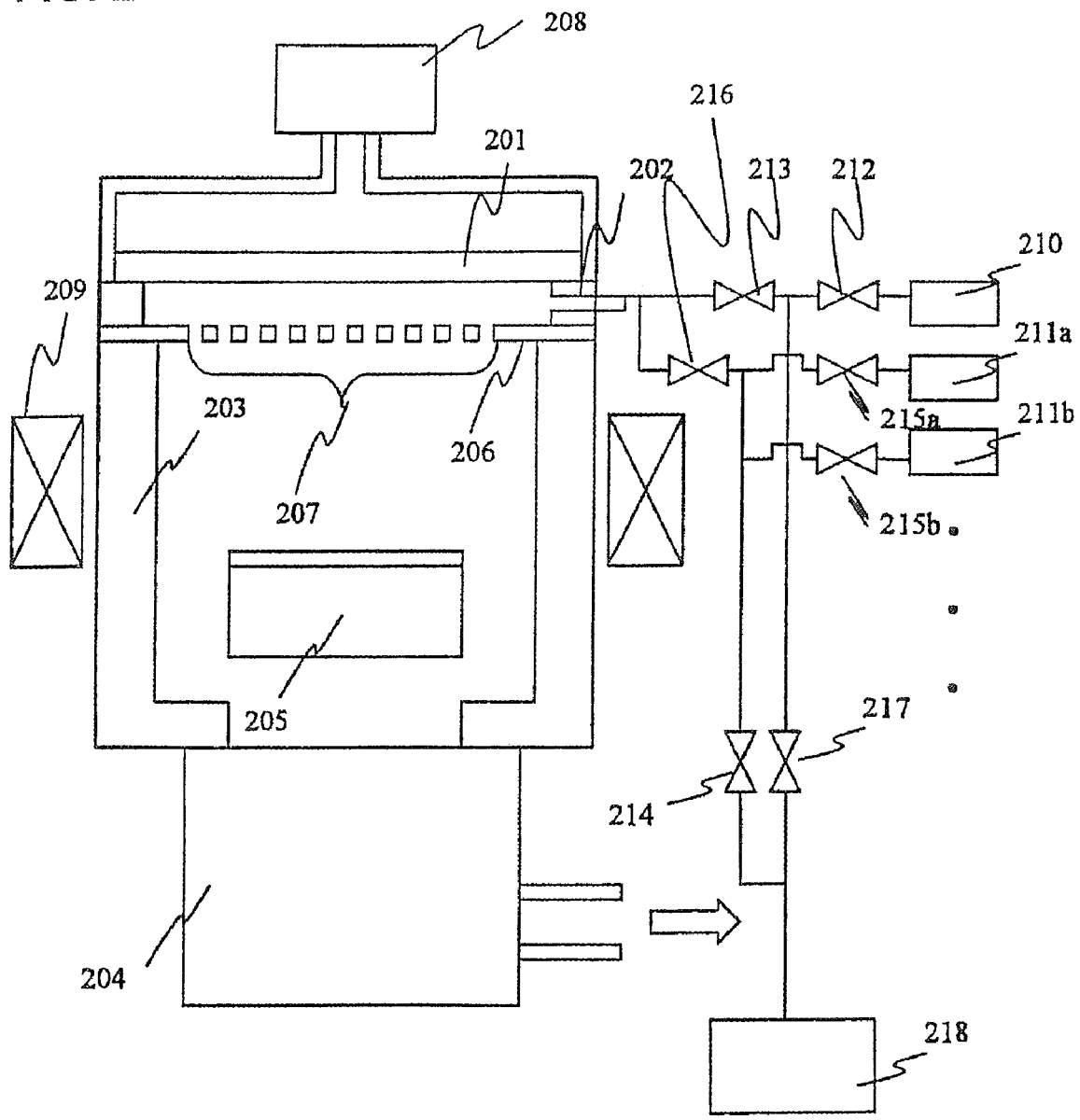
FIG. 2 is a cross-sectional view showing a typified structure of a vacuum processing chamber and a gas supply system of the plasma processing apparatus for carrying out the present invention.

FIG. 2 is referred to in describing the outline of the structures of the interior of the processing vessel and the gas supply system of the processing chamber 103. Each vacuum processing chamber is formed of a top member 201, a gas supply ring 202 and a vacuum vessel wall 203. The interior space of the processing chamber is maintained at high vacuum via a vacuum pump 204. A sample stage 205 for mounting wafers is disposed in the interior of the vacuum processing chamber. Plasma processing is performed with the wafer or object to be processed being positioned on the sample stage.

The gas used for wafer transfer, or transferring gas, is inert gas such as argon (Ar) and nitrogen ($N_2$), and the processing gas used for plasma processing includes multiple processing gases selected according to various processing conditions. During wafer transfer, the transferring gas has its flow rate controlled via a mass flow controller 210, and with valves 212 and 213 opened and valves 217 and 216 closed, the gas is supplied into the space formed between the top member 201 and a gas diffusion plate 206 through a gas supply ring 202, and introduced to the vacuum processing chamber through multiple small-diameter holes 207 formed on a gas diffusion plate 206. Wafer is carried into the processing chamber from the transfer chamber with the transferring gas supplied into the processing chamber. Even after placing the wafer on the sample stage, the supply of transferring gas into the processing chamber is maintained.

The transferring gas supplied to the interior of the vacuum vessel is turned into plasma by the electromagnetic waves generated by a magnetron 208 and the magnetic field generated by a solenoid coil 209. At this time, gas molecules are dissociated into electrons and radicals. During this time, the multiple processing gases used for plasma processing are controlled to flow rates set for actual use via mass flow controllers 211a and 211b, and with the valves 215a, 215b and 214 opened and valves 216 and 217 closed, the processing gas is flown through a discharge gas system 218 to control the gas flow rate to a stable set flow rate. After the processing gas flow rate is stabilized, the gas supply into the processing chamber is switched from transferring gas to processing gas by closing valves 213 and 214 and opening valves 216 and 217, so as to realize continuous switching of plasma processing from transferring gas to processing gas with a stable set flow rate. During the switching process, the plasma within the processing chamber is switched from plasma generated from transferring gas to plasma generated from processing gas, according to which the plasma status is maintained, and the plasma processing of the wafers (samples) is performed.

Until the plasma processing is terminated, the transferring gas is controlled to a stable set flow rate by being flown through a discharge gas system 218 with the flow rate controlled via the mass flow controller 210 and with the valves 212 and 217 opened and valve 213 closed. After terminating the plasma processing using processing gas, the valves 216 and 217 are closed and valves 213 and 214 are opened while maintaining plasma, so that the gas being supplied to the processing chamber is switched from processing gas to transferring gas with a stable set flow rate, enabling to maintain plasma continuously in the processing chamber. Then, after terminating plasma, the sample is transferred to the transfer chamber while maintaining the supply of transferring gas to the processing chamber.

Figure 3A:
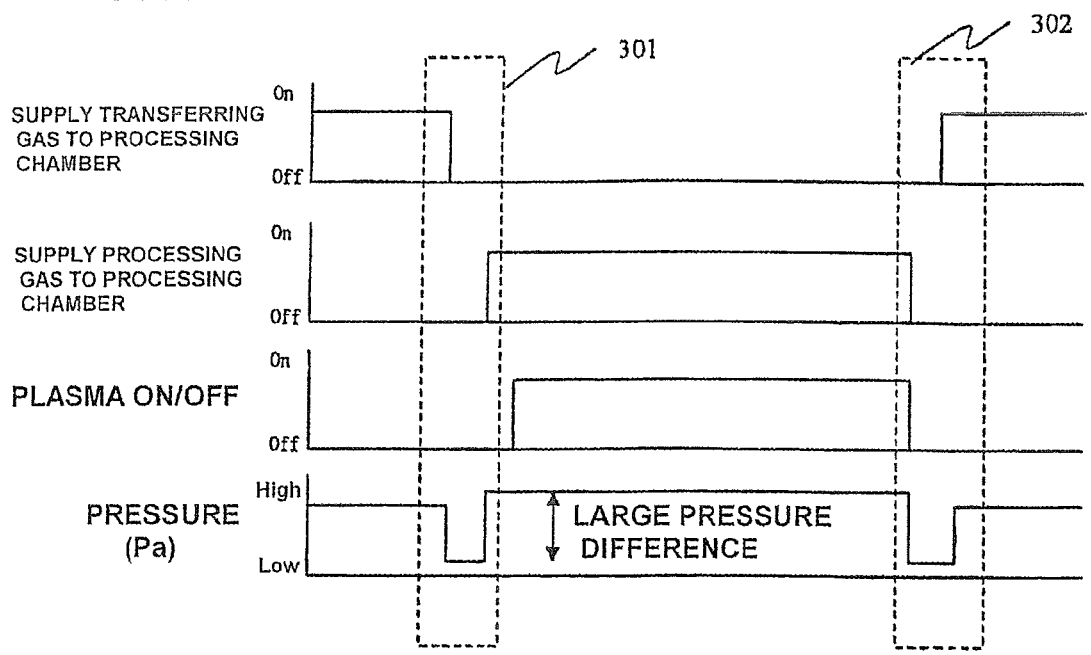
FIG. 3A is a timing chart illustrating the processes and pressure fluctuation in the processing chamber according to a common prior art method.
Figure 3B:
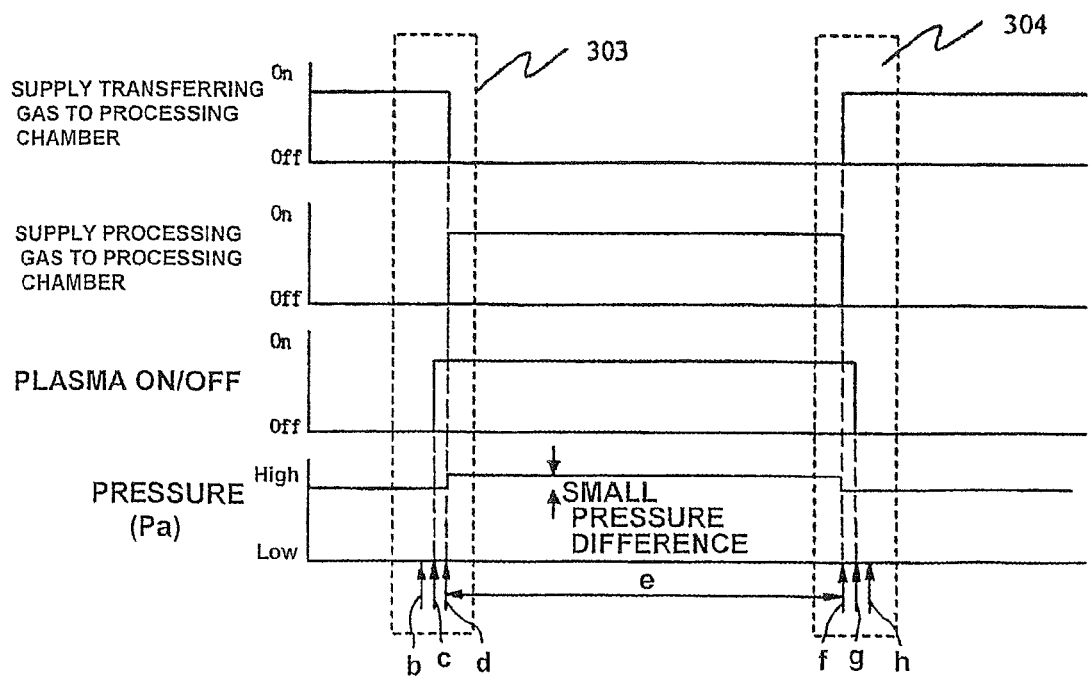
FIG. 3B is a timing chart illustrating the processes and pressure fluctuation in the processing chamber according to the preferred embodiment of the present invention.

With reference to the timing chart of FIG. 3, the timing of supplying transferring gas and processing gas into the processing chamber, the plasma processing and the pressure from when the sample is carried into the processing chamber to when the sample is carried out of the chamber is described. FIG. 3A shows a timing chart of a typical prior art process, and FIG. 3B shows a timing chart according to the present invention. In FIG. 3A, at timing 301, the supply of transferring gas to the processing chamber is stopped, and after evacuating the transferring gas, processing gas is supplied and plasma is ignited to start the plasma processing, then at timing 302, the supply of processing gas is stopped and plasma is extinguished simultaneously to terminate plasma processing, and after evacuating the processing gas, the transferring gas is supplied. Thus, the pressure within the processing chamber is fluctuated during timings 301 and 302 until the processing gas or the transferring gas is supplied.

As illustrated in FIG. 3B, according to the present invention, the following steps a through h are performed sequentially in the named order:

a; a step of supplying transferring gas into the processing chamber prior to carrying a sample into the processing chamber;

b; a step of transferring the sample from the transfer chamber into the processing chamber with the transferring gas supplied to the processing chamber;

c; a step of turning the supplied transferring gas into plasma by feeding plasma generating high frequency waves into the processing chamber and creating a magnetic field in the processing chamber;

d; a step of switching the gas supplied into the processing chamber from transferring gas to processing gas while maintaining plasma;

e; a step of subjecting the sample to plasma processing using plasma generated from processing gas by applying a bias voltage to the sample stage;

f; a step of terminating plasma processing by stopping the application of bias voltage and switching the gas supplied to the processing chamber from processing gas to transferring gas while maintaining plasma;

g; a step of maintaining the plasma generated from transferring gas and removing electricity from the chucking electrode; and h; a step of carrying the sample out of the processing chamber into the transferring chamber while maintaining supply of transferring gas into the processing chamber after terminating the plasma generated from transferring gas.

According to the present plasma processing method, it becomes possible to transfer the sample into the processing chamber with little pressure difference between the processing chamber and the transfer chamber according to step b, and thus, it becomes possible to reduce the attaching of particles to the sample caused by flinging up of particles by airflow and the like. Further, the processes of step c and step d enable the plasma processing to be started promptly and the pressure fluctuation within the processing chamber to be suppressed, according to which the throughput can be improved and the attaching of particles to the sample caused by the flinging up of particles by airflow can be reduced. Even further, the process of step f enables to minimize the fluctuation of pressure when terminating the plasma process, according to which the attaching of particles to the sample caused by the flinging up of particles by airflow can be reduced. In addition, the process of step g enables to remove the static electricity of the sample caused by the operation of the chucking electrode. Further, the process of step h enables the sample to be carried out into the transfer chamber with little pressure difference between the processing chamber and the transfer chamber, according to which the attaching of particles to the sample caused by the flinging up of particles by airflow can be reduced.

In other words, the present invention enables to reduce the pressure fluctuation in the pressure chamber during transferring of the sample after stopping the plasma and to reduce the attaching of particles caused by the flinging up of particles by airflow by introducing transferring gas into the processing chamber at timing 303, thereafter carrying the sample into the processing chamber, generating plasma from transferring gas, switching the gas supplied to the processing chamber to processing gas while maintaining plasma and performing plasma processing, and after the plasma processing is terminated, switching the gas from processing gas to transferring gas while maintaining plasma at timing 304.

Moreover, according to the present invention, it becomes possible to eliminate an evacuation process for switching gases in the processing chamber from transferring gas to processing gas or from processing gas to transferring gas, according to which the overall throughput can be improved.

Moreover, the present invention enables to effectively minimize the pressure difference even without generating plasma by merely switching the gas supplied to the processing chamber from transferring gas to processing gas or from processing gas to transferring gas.

What is claimed is:

1. A plasma processing method carried out in a plasma processing apparatus having a processing chamber for subjecting a processing sample to a plasma processing, a transfer chamber connected to the processing chamber for transferring the processing sample, and a supply system for feeding a transferring gas supplied to the transfer chamber, to both the processing chamber and the transfer chamber, or to only the processing chamber; the plasma processing method comprising:

a step of feeding the transferring gas which decreases a pressure difference between the processing chamber and the transfer chamber in order to prevent particles from adhering to the processing sample transferred to the processing chamber, before transferring the processing sample into the processing chamber;

a step of transferring the processing sample into the processing chamber while continuing to feed the transferring gas to the processing chamber after the step of feeding the transferring gas;

a step of generating a plasma from the transferring gas in the processing chamber while continuing to feed the transferring gas to the processing chamber after the step of transferring the processing sample; and a step of stopping feeding the transferring gas used in the step of generating the plasma, upon feeding a processing gas to the processing chamber for subjecting the processing sample, different from a cleaning sample, to the plasma processing while maintaining a continuous plasma in the processing chamber after the step of generating the plasma.

2. The plasma processing method according to claim 1, wherein the transferring gas is selected from argon gas, nitrogen gas, or a mixed gas composed of argon gas and nitrogen gas.

3. The plasma processing method according to claim 1, wherein during the step of generating the plasma, the processing gas is flowed through a discharge gas system to control a gas flow rate of the processing gas to a stable set flow rate, with the processing gas being supplied into the processing chamber in the step of stopping feeding the transferring gas used in the step of generating the plasma, after the gas flow rate of the processing gas has been stabilized.

4. The plasma processing method according to claim 1, wherein said plasma processing of said processing sample is different from a plasma cleaning which uses said cleaning sample.

5. A plasma processing method carried out in a plasma processing apparatus having a processing chamber for subjecting a processing sample to a plasma processing, a transfer chamber connected to the processing chamber for transferring the processing sample, and a supply system for feeding a transferring gas supplied to the transfer chamber, to both the processing chamber and the transfer chamber, or to the processing chamber, the plasma processing method comprising:

- a step of feeding the transferring gas which decreases a pressure difference between the processing chamber and the transfer chamber in order to prevent particles from adhering to the processing sample transferred to the processing chamber, before transferring the processing sample into the processing chamber;
- a step of transferring the processing sample into the processing chamber while continuing to feed the transferring gas to the processing chamber, after the step of feeding the transferring gas;
- a step of generating a plasma from the transferring gas in the processing chamber while continuing to feed the transferring gas to the processing chamber after the step of transferring the processing sample; and
- a step of changing a plasma generated in the processing chamber from the plasma of the transferring gas to a plasma of a processing gas for subjecting the processing sample, different from a cleaning sample, to the plasma processing by stopping feeding the transferring gas used in the step of generating the plasma upon feeding the process gas to the processing chamber while maintaining a continuous plasma in the processing chamber after the step of generating the plasma.

6. The plasma processing method according to claim 5, wherein the transferring gas is selected from argon gas, nitrogen gas, or a mixed gas composed of argon gas and nitrogen gas.

7. The plasma processing method according to claim 5, wherein during the step of generating the plasma, the processing gas is flowed through a discharge gas system to control a gas flow rate of the processing gas to a stable set flow rate, with the processing gas being supplied into the processing chamber in the step of changing a plasma generated in the processing chamber, after the gas flow rate of the processing gas has been stabilized.

8. The plasma processing method according to claim 5, wherein said plasma processing of said processing sample is different from a plasma cleaning which uses the cleaning sample.

* * * * *